United States Patent
Baecker et al.

(10) Patent No.: US 8,513,163 B2
(45) Date of Patent: Aug. 20, 2013

(54) SUBSTRATE FOR A SUPERCONDUCTING THIN-FILM STRIP CONDUCTOR

(75) Inventors: Michael Baecker, Cologne (DE); Theodor Schneller, Aachen (DE); Sandip Halder, Haverlee (BE)

(73) Assignee: BASF SE, Ludwigshafen (DE)

( * ) Notice: Subject to any disclaimer, the term of this patent is extended or adjusted under 35 U.S.C. 154(b) by 1424 days.

(21) Appl. No.: 12/126,242

(22) Filed: May 23, 2008

(65) Prior Publication Data
US 2008/0293576 A1   Nov. 27, 2008

(30) Foreign Application Priority Data
May 24, 2007   (DE) .......................... 10 2007 024 166

(51) Int. Cl.
*H01L 39/24* (2006.01)

(52) U.S. Cl.
USPC .......................................... 505/239; 505/237

(58) Field of Classification Search
USPC ................................... 505/237, 239; 427/62
See application file for complete search history.

(56) References Cited

U.S. PATENT DOCUMENTS

| | | | | |
|---|---|---|---|---|
| 5,217,754 A | * | 6/1993 | Santiago-Aviles et al. ... | 427/226 |
| 5,356,474 A | * | 10/1994 | Savkar ........................... | 118/719 |
| 5,958,599 A | * | 9/1999 | Goyal et al. ................... | 428/457 |
| 6,231,666 B1 | * | 5/2001 | Clem et al. ..................... | 117/4 |
| 6,251,834 B1 | * | 6/2001 | Glowacki et al. .............. | 505/239 |
| 6,428,635 B1 | * | 8/2002 | Fritzemeier et al. ........... | 148/435 |
| 6,451,450 B1 | * | 9/2002 | Goyal et al. ................... | 428/629 |
| 6,458,223 B1 | * | 10/2002 | Hans Thieme et al. ........ | 148/435 |
| 7,285,174 B2 | | 10/2007 | Eickemeyer et al. | |
| 7,727,579 B2 | | 6/2010 | Backer et al. | |
| 7,884,050 B2 | | 2/2011 | Backer | |
| 2002/0002942 A1 | * | 1/2002 | Abraham et al. ............... | 117/97 |
| 2004/0069991 A1 | * | 4/2004 | Dunn et al. ..................... | 257/75 |
| 2004/0265649 A1 | * | 12/2004 | Selvamanickam ............. | 428/701 |
| 2005/0016867 A1 | | 1/2005 | Kreiskott et al. | |
| 2005/0127133 A1 | * | 6/2005 | Selvamanickam ............. | 228/101 |
| 2006/0073979 A1 | | 4/2006 | Thieme et al. | |
| 2007/0179063 A1 | * | 8/2007 | Malozemoff et al. .......... | 505/329 |

FOREIGN PATENT DOCUMENTS

| | | |
|---|---|---|
| DE | 10143680 C1 | 5/2003 |
| JP | 2007115561 A | 5/2007 |
| WO | 00/42621 A2 | 7/2000 |
| WO | 2008000485 | 1/2008 |
| WO | 2010058031 A1 | 5/2010 |

OTHER PUBLICATIONS

Stadel et al. "Electrically conducting oxide buffer layers on biaxially textured nickel alloy tapes by reel-to-reel MOCVD process." Journal of Physics: Conference Series 43 (2006) pp. 203-206.*
Cantoni', C. et al., Growth of Oxide Seed Layers ... Texture Optimization, IEEE Transactions on Applied Superconductivity, vol. 13, No. 2, Jun. 2003, p. 2646-2650.
Dawley, J.T., et al., Chemical solution deposition of ... Ni substrates, Sandia National Laboratories, Albuquerque, New Mexico, J. Mater, Res., vol. 17, No. 7, Jul. 2002, p. 1678-1685.
Zhou et al., Strontium titanate buffer layers deposited on rolled Ni substrates with metal organic deposition, Superconductor Science and Technology, Jul. 9, 2003, pp. 901-906, Texas Center for Superconductivity and Advanced Materials, University of Houston.
Paranthaman et al., Improved YBCO Coated Conductors Using Alternate Buffer Architectures, IEEE Transactions on Applied Superconductivity, vol. 15, No. 2, Jun. 2005, pp. 2632-2634.
Stewart et al., Studies of solution deposited cerium oxide thin films on textured Ni-alloy substrates for YBCO superconductor, www.sciencedirect.com, Materials Research Bulletin 41 (2006), 1063-1068.
Cantoni, C. et al., "Quantification and Control of the Sulfur c(2x2) superstructure on (100)(100) Ni for optimization of YSZ, CeO2, and SrTiO3 seed layer texture," J. Mater. Res., vol. 17, No. 10, (Oct. 2002).

* cited by examiner

*Primary Examiner* — Paul Wartalowicz
(74) *Attorney, Agent, or Firm* — Edell, Shapiro & Finnan, LLC

(57) ABSTRACT

A high-temperature superconducting thin-film strip conductor (HTSL-CC) includes a metal substrate, a buffer layer chemically generated thereon and grown crystallographically unrotated in relation to the metal substrate, and a chemically generated superconducting coating thereon. The HTSL-CC possesses high texturing of the buffer layer since the metal substrate has a surface roughness RMS<50 nm, and since and the buffer layer is grown directly onto its surface, without an intermediate layer, crystallographically unrotated in relation to the crystalline structure of the metal substrate.

19 Claims, No Drawings

SUBSTRATE FOR A SUPERCONDUCTING THIN-FILM STRIP CONDUCTOR

CROSS REFERENCE TO RELATED APPLICATIONS

This application claims priority under 35 U.S.C. §119 to Application No. DE 102007024166.8 filed on 24 May 2007, entitled "Metal Substrate for a Superconducting Thin-Film Strip Conductor," the entire contents of which are hereby incorporated by reference.

FIELD OF THE INVENTION

The invention is directed toward a high-temperature superconducting thin-film strip conductor and, in particular, toward a conductor having a metal substrate.

BACKGROUND OF THE INVENTION

High-temperature superconducting thin-film strip conductors (HTSL-CC), also called coated conductors, are typically produced starting from a textured metal substrate formed from a face-centered cubic crystallizing metal (e.g., nickel, copper, gold). Nickel is especially suitable, in particular nickel having a few at % tungsten. The textured metal substrate is coated with a buffer layer, which transfers the texture of the metal substrate to a superconducting layer generated subsequently on the buffer layer. The buffer layer may be formed from materials having a low lattice mismatch to both the metal substrate and the high-temperature superconducting thin-film to be crystallized. Exemplary materials include materials that grow rotated by 45° on the metal substrate (e.g., lanthanum zirconate) and materials having fluoride or pyrochloride structure, as well as materials that grow unrotated and possess a perovskite structure (e.g., strontium titanate and calcium titanate) or a spinel structure (e.g., strontium ruthenate and neodymium nickelate).

Due to contaminants within the metal substrate, a chalcogenide superstructure (such as a sulfur superstructure) normally forms on the metal substrate. This superstructure encourages the epitactic growth of buffer layers deposited via physical methods (e.g., vapor deposition of the metal substrate in high vacuum). Therefore, it is desirable to reproducibly generate a uniform superstructure having a high degree of coverage. Unfortunately, the physical deposition of the buffer layer is costly; consequently, it is not suitable for the production of an HTSL-CC, or even its carrier (metal) substrate.

An HTSL-CC may also be produced utilizing chemical coating methods (e.g., chemical solution deposition (CSD) and metal organic deposition (MOD)), which tend to be more cost effective. Results comparable to those achieved via physical methods, however, have not been achieved in materials that do not grow rotated by 45° (like lanthanum zirconate), or that are unrotated (e.g., strontium titanate, etc). Even if a metal substrate possessing a low surface roughness is used, the resulting structure includes strontium titanate layers are untextured or only weakly textured.

Thus, it would be desirable to provide an HTSL-CC formed via chemical coating methods that use materials that grow unrotated on the substrate, as well as to provide a highly-textured buffer layer and/or superconducting layer.

SUMMARY OF THE INVENTION

The invention is directed toward producing a high-temperature superconducting thin-film strip conductor (HTSL-CC) having highly-textured buffer layer and, in particular, toward processing a metal substrate utilized as a starting material for an HTSL-CC layer. The HTSL-CC strip may be formed by providing a biaxially textured metal substrate as a starting material; removing the superstructure of the metal substrate; optionally cleaning the metal substrate after removing the superstructure; chemically generating a buffer layer on the substrate after removing the superstructure; and chemically generating a superconducting coating thereon. The superstructure may be a chalcogenide superstructure. The buffer layer is grown crystallographically unrotated in relation to the crystal structure metal substrate. For example, the buffer layer may be formed from a material having a lattice constant that deviates from that of the metal substrate by less than about ±15%. The metal substrate, moreover, may be polished to a surface roughness of less than about 50 nm.

DETAILED DESCRIPTION OF THE INVENTION

It has been determined that a superstructure (e.g., a chalcogenide superstructure such as a sulfur superstructure), while necessary for buffer layers generated using physical methods, as well as for buffer layers having a fluoride or pyrochloride structure generated via chemical methods, actually prevents the formation of a good texture in buffer layers chemically generated and formed from materials that grow unrotated, such as those having perovskite or spinel structure. However, it has been determined that the removal of the superstructure before the generation of the buffer layer creates a highly-textured buffer layer.

In one embodiment, the process includes (1) providing a starting material including a superstructure; (2) removing the superstructure from the starting material; (3) chemically generating a buffer layer on the starting material; and (4) forming a superconducting coating thereon. The starting material is a metal substrate or strip such as a biaxially textured metal substrate. Nickel or a nickel alloy which contains 85 at %, preferably 90 at % nickel, is especially suitable as the metal substrate. In and embodiment, the metal substrate contains at least 85 at-%, preferably 90 at-% nickel. The substrates may be rolled and shaped, as well as crystallized in a batch annealing process. By way of example, a sulfur superstructure may form on the metal substrate through slow cooling in a batch annealing process.

The metal substrate may be treated before the formation of the buffer layer thereon. For example, the metal substrate may be processed (i.e., the superstructure removed) until it possesses a surface roughness (i.e., a root mean square (RMS) roughness, $S_q$) of about 50 nm or less. For example, the metal substrate may possess an RMS of about 20 nm or less, and preferably, of about 10 nm or less. The superstructure may be removed utilizing processes such as polishing (e.g., mechanical polishing and electro-polishing), peening (i.e., utilizing peening bodies such as dry ice particles), or selective etching using weakly concentrated nitric acid). For example, excellent results are obtained when the substrate is polished to a surface roughness of less than 10 nm in the course of the removal of the superstructure The metal substrate, moreover, may be cleaned before the formation of the buffer layer, but after the removal of the superstructure. By way of example, the metal substrate may be cleaned via an ultrasonic bath. Alternatively or in addition to, the metal substrate may be degreased utilizing degreasing agents such as acetone and/or isopropanol.

The buffer layer is chemically generated onto the metal substrate. The buffer layer is formed from materials that are grown crystallographically unrotated in relation to the metal substrate. By way of example, a material whose lattice constant deviates from the lattice constant of the metal substrate by less than about ±15%, preferably less than about ±10%, is advantageously used for the buffer layer. By way of further example, materials forming the buffer layer possess lattice constants that deviate from the lattice constant of the metal substrate by an amount in the range of about −5% to +15%. Specifically, titanates, ruthenates, manganates, nickelates, and cuprates, are suitable as the buffer layer materials (e.g., $CaTiO_3$, $La_2NiO_4$, $Sr_2RuO_4$, $NdBa_2Cu3O_x$, $Gd_2CuO_4$, $SrTiO_3$, $Nd_2CuO_4$, $BaTiO_3$, $(Ca_xSr_{1-x})TiO_3$, and $(Sr_xBa_{1-x})TiO_3$). The buffer layer may be grown directly onto the surface of the substrate, i.e., without an intermediate layer.

Once the buffer layer is formed on the metal substrate, the superconducting layer may be generated on the buffer layer.

The chemical generation processes include, but is not limited to, chemical solution deposition (CSD) and metal organic deposition (MOD). In addition, coating processes such as spin coating, dip coating, or printing (slot-die casting, inkjet printing) may be utilized.

The resulting biaxially-textured, metal substrate without a superstructure may be utilized in forming a high-temperature superconducting thin-film strip conductor (HTSL-CC).

Utilizing the inventive process, formation of highly-textured buffer layers is achieved regardless of the process utilized to remove the superstructure (e.g., polishing, peening, or etching), or of the chemical coating process utilized (e.g., spin coating, dip coating, or printing). The results, moreover, are independent of the parameters of subsequent (post-formation) processes such as annealing temperature, atmosphere, and retention time.

EXAMPLE

Two different nickel (5 at % tungsten) metal substrates (obtained from EVICO GmbH, Dresden, Germany) were utilized as the starting material. The strips possessed a width of 10 mm and thickness of 80 μm. These metal substrates both had a cubic texture (001) with a full width at half maximum (FWHM) of 5.5°. Both substrates were subjected to an identical rolling shaping and subsequently re-crystallized in a batch annealing process. A sulfur superstructure formed on both substrates through slow cooling in the batch annealing process.

The roughness of the two metal substrates was measured using an atomic force microscope (AFM). The measurement for each substrate was:
  Substrate 1: RMS=40 nm
  Substrate 2: RMS=5 nm A substrate without a superstructure was also formed. Specifically, a portion of Substrate 1 was mechanically polished. The polishing was performed utilizing a polishing table having a 0.1 μm diamond suspension (obtained from Struers, Inc., Cleveland, Ohio, USA). The polishing reduced the roughness of Substrate 1 from RMS=40 nm to RMS=5 nm. This substrate was labeled Substrate 3. The polishing removed any and all surface layers adhering to the metal substrate, and, in particular, the sulfur superstructure. No further annealing treatment was performed on the substrate before coating it with the buffer layer material; consequently, no superstructure was produced thereon.

All substrates were cleaned in the ultrasonic bath. First an acetone bath was utilized, being applied for about five minutes. Second, an isopropanol bath was utilized, also being applied applying for about five minutes.

To summarize, the resulting substrates available for experimentation were:

Substrate 1: RMS=40 nm; sulfur superstructure;
Substrate 2: RMS=5 nm; sulfur superstructure; and
Substrate 3: RMS=5 nm; no sulfur superstructure (removed via polishing)

Next, three coating solutions were produced:
Solution 1: pure strontium titanate (STO)
Solution 2: niobium-doped STO, electrically conductive
Solution 3: calcium-doped STO, better lattice matching to the nickel substrate For solution 1, 0.15 mol $Ti(OCH_2CH_2CH_2CH_3)_4$ was dissolved in acetyl acetone in a molar ratio of 1:2. Subsequently, 0.15 mol strontium acetate was dissolved in glacial acetic acid a the molar ratio of 1:5. Both solutions were combined and diluted to 500 mL (using a mixture made of glacial acetic acid and methoxy ethanol) in such a manner that the total ratio of glacial acetic acid and methoxy ethanol was 1:2. The solution was subsequently filtered to remove any possible precipitant. An analysis using an inductively coupled plasma optical emission spectrometer (ICP-OES) (the Genesis ICP Spectrometer, obtained from SPECTRO, Mahwah, N.J., USA) showed a stoichiometric 0.3 molar solution.

For solution 2, 0.1425 mol $Ti(OCH_2CH_2CH_2CH_3)_4$ was dissolved in acetyl acetone and the molar ratio 1:2 and admixed with 0.0075 mol $Nb(OCH_2CH_3)_5$ dissolved in butanol. All further steps were performed as for solution 1, so that a 0.3 molar coating solution for a strontium titanate having 5% niobium doping was obtained.

Solution 3 was produced in a manner similar to that of solution 1, but instead of 0.15 mol strontium acetate, a mixture made of 0.135 mol strontium acetate and 0.015 mol calcium acetate was used. A 0.3 molar coating solution for a calcium-substituted strontium titanate was obtained.

All cleaned substrates were coated with all solutions as follows:

The cleaned substrate of 5 cm length was first coated on a spin coater at 500 rpm using a coating solution diluted by the factor of 6. The dilution was performed using a mixture 2:1 made of glacial acetic acid and methoxy ethanol. Subsequently, the temperature treatment was performed under 10% $H_2$ in $N_2$ at a temperature of 800° C. for five minutes. A seed layer arose in the first coating step due to the dilution of the solutions, i.e., a non-coherent layer (coverage between 20-80%) whose islands act as crystallization seeds for following layers.

Two further coatings and temperature treatments were performed under the same conditions, but with undiluted solutions. The resulting total layer thickness was 250 nm in each case after three coatings. The layer thickness was measured using a profile meter over a layer edge.

Experiments on varying the annealing temperature between 750 and 900° and the annealing atmosphere between 5-15% $H_2$ in $N_2$ did not show any significant influence on the experimental result. When a dip coating facility was used, all solutions had to be diluted by a factor of 2 at a coating speed of 10 m/h to achieve the same result. Higher dip speeds required lower dilutions.

The following results were observed for solution 1 (STO) for the 3 substrates, where the ratio I of 200 (32°) to 110 (47°) reflection was used as a measure. A good texture may be assumed from a value of approximately 5.

TABLE I

|  | Substrate 1 | Substrate 2 | Substrate 3 |
| --- | --- | --- | --- |
| I (200)/I (110) | 1 | 2 | 6 |

As shown in the above table (Table I), the removal of the sulfur superstructure in substrate 3 improved the texture of the buffer layer three-fold at the same surface roughness as a substrate 2.

What is claimed is:

1. A method of forming a high-temperature superconducting thin-film strip conductor, the method comprising:
    (a) obtaining a metal substrate including a surface on which a chalcogenide superstructure has formed;
    (b) removing the chalcogenide superstructure from the metal substrate;
    (c) generating via chemical solution deposition a buffer layer on the surface of the metal substrate, wherein the buffer layer comprises material that grows crystallographically unrotated in relation to the metal substrate; and
    (d) chemically generating a superconducting layer on the buffer layer.

2. The method according to claim 1, wherein the buffer layer comprises material selected from the group consisting of titanates, ruthenates, manganates, nickelates, and cuprates.

3. The method according to claim 2, wherein the buffer layer comprises one or more of $CaTiO_3$, $La_2NiO_4$, $Sr_2RuO_4$, $Gd_2CuO_4$, $SrTiO_3$, $Nd_2CuO_4$, and $BaTiO_3$.

4. The method according to claim 1, further comprising (e) cleaning the metal substrate after removing the superstructure but before generating the buffer layer.

5. The method according to claim 4, wherein (e) comprises:
    (e.1) cleaning the metal substrate in an ultrasonic bath; and
    (e.2) degreasing the metal substrate by applying acetone and isopropanol to the substrate.

6. The method according to claim 1, wherein the metal substrate is a biaxially-textured metal substrate.

7. The method according to claim 1 further comprising (e) processing the metal substrate to lower its surface roughness to an RMS value of less than about 50 nm before generating the buffer layer.

8. The method according to claim 1, wherein (b) comprises (b.1) removing the superstructure via polishing.

9. The method according to claim 1, wherein:
    the metal substrate possesses a lattice constant value; and
    the buffer layer is formed from a material having a lattice constant value that deviates from the lattice constant value of the metal substrate by less than about ±15%.

10. The method according to claim 1, wherein the metal substrate comprises at least 85 at % nickel.

11. The method according to claim 1, wherein the metal substrate comprises a nickel-tungsten alloy.

12. The method of claim 1, wherein the substrate comprises nickel-tungsten alloy including tungsten and from 90 at % to 95 at % nickel.

13. A method of forming a high-temperature superconducting thin-film strip conductor, the method comprising, in order:
    obtaining a biaxially-textured metal substrate comprising a nickel-tungsten alloy, the metal substrate including a chalcogenide superstructure and possessing a crystal structure;
    removing the superstructure from the metal substrate;
    applying a buffer layer solution directly onto the metal substrate from which the chalcogenide superstructure has been removed to form a textured buffer layer, wherein the buffer layer solution comprises buffer material that grows crystallographically unrotated in relation to the crystal structure of the metal substrate; and
    forming a superconducting layer on the buffer layer via a chemical generation process selected from the group consisting of chemical solution deposition, spin coating, dip coating, and printing.

14. The method according to claim 13, wherein the buffer material is selected from the group consisting of titanates, ruthenates, manganates, nickelates, and cuprates.

15. The method according to claim 14, wherein the metal substrate has a surface roughness RMS of less than about 50 nm.

16. The method according to claim 13, wherein the material forming the buffer layer is selected from the group consisting of $La_2NiO_4$, $Sr_2RuO_4$, and $Gd_2CuO_4$.

17. The method according to claim 13, wherein:
    the substrate possesses a lattice constant value; and
    the buffer material possesses a lattice constant value that deviates from the lattice constant value of the metal substrate by less than about ±15%.

18. The method according to claim 13, wherein:
    the buffer material is selected from the group consisting of material that forms a perovskite structure and material that forms a spinel structure; and
    the substrate comprises 85 at % to 95 at % nickel;
    the substrate possesses a lattice constant value; and
    the buffer material possesses a lattice constant value that deviates from the lattice constant value of the metal substrate by an amount in the range of about −5% to about +15%.

19. The method according to claim 13, wherein the chalcogenide superstructure is a sulfur superstructure.

* * * * *